(12) United States Patent
Qi (10) Patent No.: US 11,315,824 B2
(45) Date of Patent: Apr. 26, 2022

(54) TRENCH ISOLATION STRUCTURE AND MANUFACTURING METHOD THEREFOR

(71) Applicant: CSMC Technologies FAB2 Co., Ltd., Wuxi New District (CN)

(72) Inventor: Shukun Qi, Wuxi New District (CN)

(73) Assignee: CSMC TECHNOLOGIES FAB2 CO., LTD., Wuxi New District (CN)

( * ) Notice: Subject to any disclaimer, the term of this patent is extended or adjusted under 35 U.S.C. 154(b) by 191 days.

(21) Appl. No.: 16/483,081

(22) PCT Filed: Jul. 3, 2018

(86) PCT No.: PCT/CN2018/094369
§ 371 (c)(1),
(2) Date: Aug. 2, 2019

(87) PCT Pub. No.: WO2019/007347
PCT Pub. Date: Jan. 10, 2019

(65) Prior Publication Data
US 2021/0287932 A1    Sep. 16, 2021

(30) Foreign Application Priority Data
Jul. 3, 2017   (CN) .......................... 201710534677.7

(51) Int. Cl.
*H01L 21/762*   (2006.01)
*H01L 21/02*   (2006.01)
(Continued)

(52) U.S. Cl.
CPC .. *H01L 21/76235* (2013.01); *H01L 21/02164* (2013.01); *H01L 21/02236* (2013.01);
(Continued)

(58) Field of Classification Search
None
See application file for complete search history.

(56) References Cited

U.S. PATENT DOCUMENTS 5,358,891 A    10/1994  Tsang et al.
6,020,230 A     2/2000  Wu
(Continued)

FOREIGN PATENT DOCUMENTS

CN          1531098 A  *  9/2004  .......... H01L 29/402
CN        201038163 Y     3/2008
(Continued)

OTHER PUBLICATIONS

CN_1531098_A_I_English_Translation (Year: 2004).*
(Continued)

*Primary Examiner* — Khaja Ahmad
(74) *Attorney, Agent, or Firm* — Mark Malek; Widerman Malek, PL (57) ABSTRACT

A method for manufacturing a trench isolation structure comprising forming a shallow trench having a wider upper section and a narrower lower section in a wafer surface, removing part of the silicon oxide by etching, forming a silicon oxide corner structure at a corner at a top corner of the shallow trench by thermal oxidation, depositing silicon nitride on the wafer surface to cover surfaces of the shallow trench silicon oxide and the silicon oxide corner structure, dry etching the silicon nitride on the shallow trench silicon oxide surface thereby forming masking silicon nitride residues extending into the trench, etching downwards to form a deep trench, forming silicon oxide layers on a side wall and the bottom of the deep trench, depositing polycrystalline silicon in the shallow and deep trenches, removing the silicon nitride, and forming silicon oxide in the shallow trench to cover the polycrystalline silicon.

18 Claims, 6 Drawing Sheets

(51) Int. Cl.
  *H01L 21/265*   (2006.01)
  *H01L 21/3105*  (2006.01)
  *H01L 21/311*   (2006.01)
  *H01L 21/32*    (2006.01)
  *H01L 21/761*   (2006.01)
  *H01L 29/06*    (2006.01)

(52) U.S. Cl.
  CPC .. *H01L 21/02255* (2013.01); *H01L 21/02274* (2013.01); *H01L 21/26513* (2013.01); *H01L 21/31053* (2013.01); *H01L 21/31116* (2013.01); *H01L 21/32* (2013.01); *H01L 21/761* (2013.01); *H01L 29/0646* (2013.01); *H01L 29/0649* (2013.01)

(56) References Cited

U.S. PATENT DOCUMENTS

| | | | | |
|---|---|---|---|---|
| 6,043,135 | A * | 3/2000 | Noda | H01L 21/76221 |
| | | | | 438/404 |
| 2002/0004311 | A1 | 1/2002 | Tien | |
| 2002/0081809 | A1 | 6/2002 | Pinto et al. | |
| 2002/0179997 | A1 | 12/2002 | Goth et al. | |
| 2007/0132056 | A1 | 6/2007 | Williams | |
| 2011/0070708 | A1 * | 3/2011 | Hsieh | H01L 29/7813 |
| | | | | 438/270 |
| 2014/0159144 | A1 * | 6/2014 | Cheng | H01L 29/0634 |
| | | | | 257/330 |
| 2014/0199814 | A1 | 7/2014 | Darwish | |

FOREIGN PATENT DOCUMENTS

| | | |
|---|---|---|
| CN | 102024848 A | 4/2011 |
| CN | 102097358 A | 6/2011 |
| CN | 102723277 A | 10/2012 |
| CN | 104409410 A | 3/2015 |
| CN | 105789133 A | 7/2016 |
| JP | 198512647 A | 7/1985 |
| JP | 1991215943 A | 9/1991 |
| KR | 20030050199 A | 6/2003 |

OTHER PUBLICATIONS

State Intellectual Property Office, International Search Report, dated Sep. 20, 2018, China.

Office Action, China National Intellectual Property Office, Application No. 201710534677.7, dated Mar. 18, 2020.

Japanese Office action dated Aug. 31, 2020 in corresponding foreign application; 2 pages.

* cited by examiner

FIG. 7

TRENCH ISOLATION STRUCTURE AND MANUFACTURING METHOD THEREFOR

TECHNICAL FIELD

The present disclosure relates to semiconductor manufacturing field, and in particular to a method of manufacturing trench isolation structure, and a trench isolation structure.

BACKGROUND

In the field of intelligent power management, display, motor drive, and automotive electronics, the requirements for high efficiency and energy saving are increasing on daily basis. High voltage power fields have also derived such as lateral double diffusion metal oxide semiconductor (LD-MOS) field effect transistors, lateral insulated gate bipolar transistors (LIGBT), power-double diffusion metal oxide semiconductor field, effect transistor (Power-DMOS) and, other device structures with different voltage levels and different structures whose withstand voltage range from tens of volts to hundreds of volts, thus various field plates, field rings and other terminal structures and RESURF (reduced surface electric field) technologies have been developed to assist these high voltage power devices to ensure a lower specific on-resistance, which poses a high requirement for device isolation techniques.

Among them, deep trench isolation (DTI) technology as a general technology, with its small size, low leakage, bidirectional isolation, can be widely used. But because the performance of high voltage power devices is quite dependent, on isolation techniques, especially when the device avalanche breakdown forms a large number of hot electrons/holes, some of which overcome the $Si/SiO_2$ barrier into the oxide layer of the DTI, are trapped by traps at the oxide/polysilicon interface in the DTI (the areal density of the traps is at the scale of $E+10/cm^2$) and drift in the polysilicon under the influence of an electric field, thereby causing cross-talk between devices, which is likely to cause isolation failure and lower pressure resistance. Therefore, continuous improvement of deep trench isolation process technology is one of the key points in the field of high voltage power devices.

SUMMARY

According to embodiments of the disclosure, a trench isolation structure and a method of manufacturing the same are provided.

A method of manufacturing a trench isolation structure includes: forming a first trench having a wide top and a narrow bottom on a surface of the wafer; filling silicon oxide into the first trench by depositing; removing a portion of a surface of the silicon oxide in the first trench by etching; forming a silicon oxide corner structure at a corner of the top of the first trench by thermal oxidation, the silicon oxide corner structure being a structure in which the silicon oxide in the first trench gradually becomes thicker from the corner downward; depositing a nitrogen-containing compound on the surface of the wafer to cover the surface of the silicon oxide in the first trench and a surface of the silicon oxide corner structure; dry-etching the nitrogen-containing compound, removing the nitrogen-containing compound on the surface of the silicon oxide in the first trench, and forming a nitrogen-containing compound sidewall residue extending into the trench on the surface of the silicon oxide corner structure; continuing etching the silicon oxide and the wafer downwardly using the nitrogen-containing compound sidewall residue as a mask and forming a second trench; forming a silicon oxide layer on a sidewall and a bottom of the second trench; depositing, polysilicon into the first trench and the second trench; removing the nitrogen-containing compound; and forming silicon oxide in the first trench to cover the polysilicon.

A trench isolation structure includes: a trench including a bottle mouth structure with a wide top and a narrow bottom and a bottle body structure extending downwardly from the bottle mouth structure; silicon oxide filled in the trench; and polysilicon, located in the trench and surrounded by the silicon oxide.

Details of one or more embodiments of the disclosure will be introduced in the drawings and descriptions as follows. And other characteristics, purposes and advantages of the present disclosure will be apparent from the specification, drawings and appended claims.

BRIEF DESCRIPTION OF THE DRAWINGS

To illustrate the technical solutions according to the embodiments of the present disclosure or in the prior art more clearly, the accompanying drawings for describing the embodiments or the prior art are introduced briefly in the following. Apparently, the accompanying drawings in the following description are only some embodiments of the present disclosure, and persons of ordinary skill in the art can derive other drawings from the accompanying drawings without creative efforts.

DETAILED DESCRIPTION OF THE EMBODIMENTS

Embodiments of the disclosure are described more fully hereinafter with reference to the accompanying drawings. The various embodiments of the disclosure may, however, be embodied in many different forms and should not be construed as limited to the embodiments set forth herein. Rather, these embodiments are provided so that this disclosure will be thorough and complete, and will fully convey the scope of the disclosure to those skilled in the art.

Unless otherwise defined, all terms (including technical and scientific terms) used herein have the same meaning as commonly understood by one of ordinary skill in the art to which this disclosure belongs. It will be further understood that terms used in the specification of the disclosure should be interpreted for the purpose of describing particular embodiments as opposed to limiting the disclosure, the term "and/or" includes any and all combinations of one or more listed items.

The semiconductor terminology used herein is a technical vocabulary commonly used by those skilled in the art, for example, for P type and N type impurities, in order to distinguish doping concentrations, P+ type represents P type of heavy doping concentration, P type represents P type of moderate doping concentration, the P− type represents the P type of light doping concentration, the N+ type represents the N type of heavy doping concentration, the N type represents the N type of the moderate doping concentration, and the N− type represents the N type of the light doping concentration.

Figure 1:
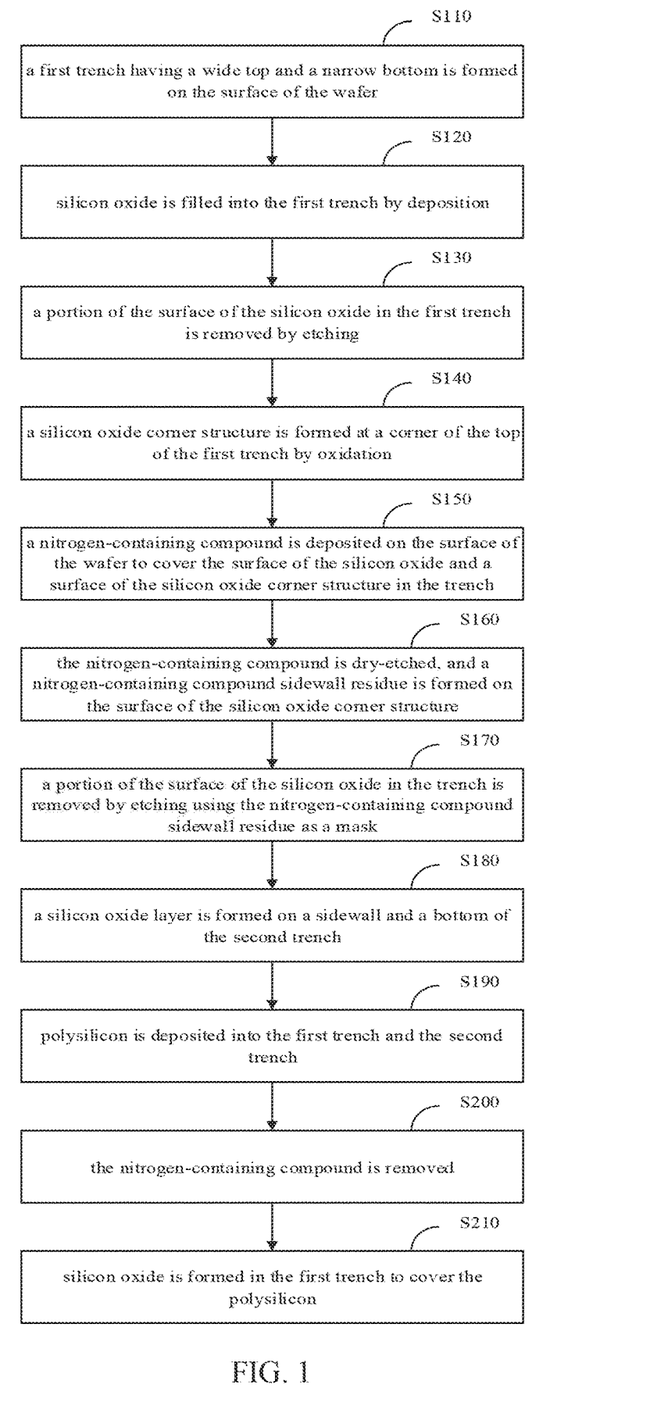
FIG. 1 is a flowchart of a method of manufacturing a trench isolation structure according to an embodiment.

FIG. 1 is a flowchart of a method of manufacturing a trench isolation structure according to an embodiment, which includes the following steps:

In step S110, a first trench having a wide top and a narrow bottom is formed on the surface of the wafer.

The first trench (shallow trench) having the wide top and the narrow bottom may be etched on the surface of the wafer (silicon wafer in this embodiment) using processes known in the art. In the embodiment, a silicon nitride film can be formed on the surface of the wafer before the first trench is formed by etching, an etch window is formed on the silicon nitride film by patterning a photoresist, and then the first trench is formed by etching through the silicon nitride film via the etch window, a silicon nitride layer is formed around the top of the first trench after the etching is completed. In this embodiment, the etching of the first trench is dry-etching using $CHCl_3$ and/or $CH_2Cl_2$ as an etchant, and other trench etching processes known in the art may be used in other embodiments.

The upper portion of the first trench has a relatively greater width, so that the resulting trench isolation structure can reduce the potential of leakage due to high voltage routing over the trench isolation structure comparing to a narrow trench. In an embodiment, the first trench has a depth of 1 to 2 μm.

In an embodiment, an epitaxial layer of low doping concentration is epitaxially grown on the substrate of high doping concentration by an epitaxial process, and the trench obtained by the etching of step S110 is formed in the epitaxial layer.

In step S120, silicon oxide is filled into the first trench by deposition.

The rate at which a silicon oxide (SiOx) layer is formed by a deposition process is much greater than the rate at which a silicon oxide layer is grown by conventional thermal oxidation. In this embodiment, the step S120 uses a high density plasma chemical vapor deposition (HDPCVD) process for the deposition of silicon oxide, thus a better morphology can be obtained. In other embodiments, other deposition processes known in the art may be used to deposit the silicon oxide layer according to actual requirements.

After the deposition, the excess silicon oxide layer can be removed by chemical mechanical polishing (CMP), i.e., the silicon oxide layer exposed outside the trench is removed. For an embodiment in which the first trench is etched using silicon nitride as a hard mask in step S110, the CMP is performed by polishing a silicon oxide layer to the silicon nitride layer.

In an embodiment, prior to step S120, the method further includes a step of performing sidewall oxidation on the first trench to form a sidewall oxide layer 204. The sidewall oxidation may serve to repair defects (e.g., defects due to impact of high-energy particles of reactive ion etching) generated at the silicon surface of the inner wall and bottom of the first trench during etching of the trench in step S110, and the negative effect of this defect on the gate oxygen generation is eliminated.

In step S130, a portion of the surface of the silicon oxide in the first trench is removed by etching.

Figure 2:
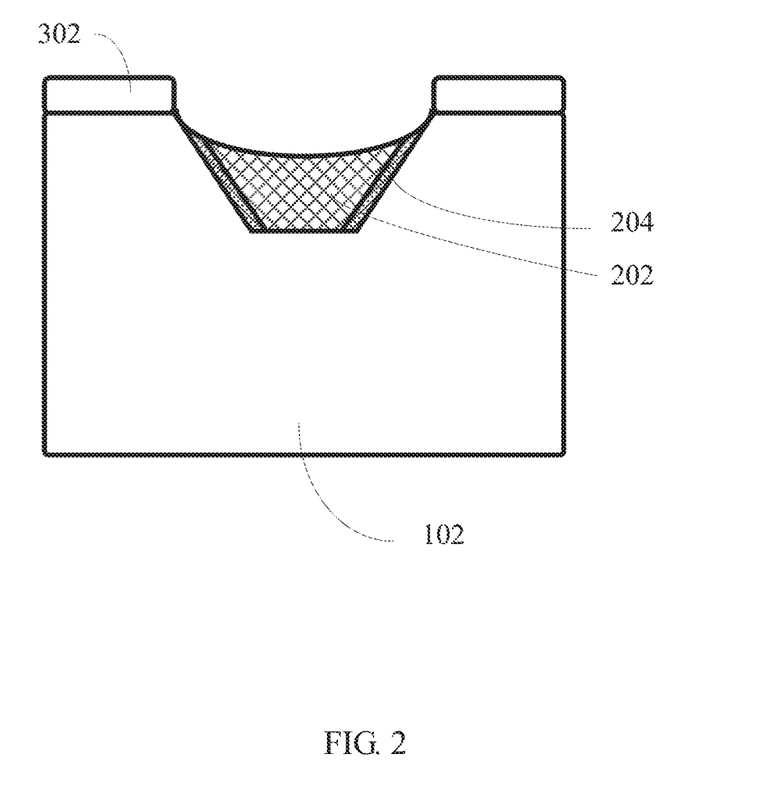
FIGS. 2 to 7 are cross-sectional views of a device manufactured using a method of manufacturing a trench isolation structure during a manufacturing process according to an embodiment.

Dry-etching may be used to obtain a suitable morphology using its anisotropy. FIG. 2 is a cross-sectional view of the device after step S130 is completed in this embodiment. In an embodiment, the high density plasma etching process is used in the step S130.

In step S140, a silicon oxide corner structure is formed at a corner of the top of the first trench by oxidation.

Figure 3:
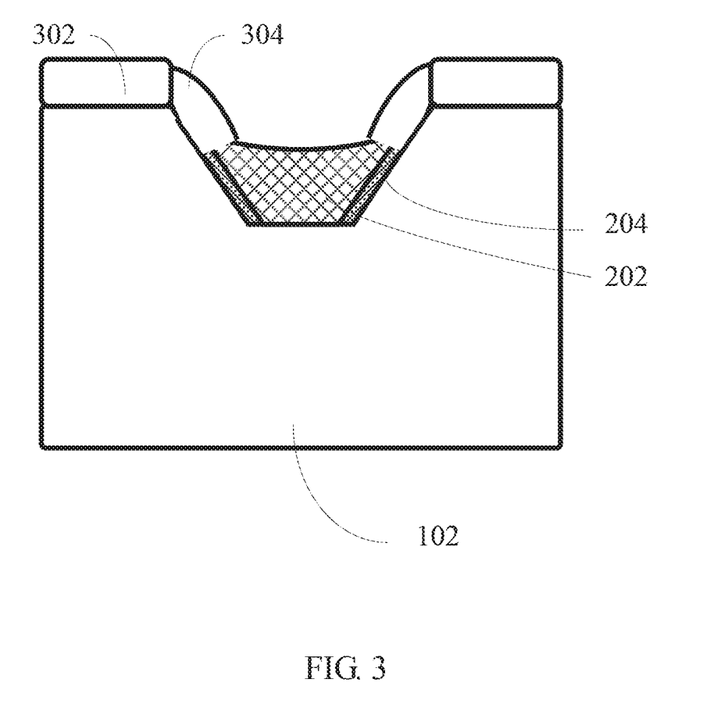

In order to allow the nitrogen-containing compound, sidewall residue obtained in the subsequent steps to have the desired morphology, a special corner morphology is formed by oxidation after etching, i.e., a semi-spherical concave surface is formed on the surface of the silicon oxide in the trench. The silicon oxide in the trench gradually becomes thicker from the corner downward, thereby forming a rounded corner, as shown in FIG. 3. In FIG. 3, a first trench is formed on the surface of the silicon wafer, the first trench is filled with silicon oxide 202, and a silicon, nitride layer 302 is formed around the top of the first trench. In this embodiment, the silicon oxide corner structure is obtained by low-temperature oxidation of 800° C. to 950° C. The low temperature oxidation is employed because the inventors have found that if a higher temperature (e.g., sacrificial oxidation of 1000° C.) is used, the dopant ions in the high concentration substrate of the wafer are easily reverse diffused into the low concentration epitaxial layer 102, which has a negative effect for the performance of the device.

In step S150, a silicon nitride is deposited on the surface of the wafer to cover the surface of the silicon oxide and a surface of the silicon oxide corner structure in the first trench.

In this embodiment, a thin layer of nitrogen-containing compound is formed by chemical vapor deposition, which is subsequently used as a hard mask for etching. The nitrogen-containing compound may be silicon nitride, silicon ox nitride, boron nitride, and titanium nitride, etc. In view of universality, silicon nitride commonly used in the art may be used.

In step S160, the nitrogen-containing compound is dry-etched, and a nitrogen-containing compound sidewall residue on the surface of the silicon oxide corner structure extending into the first trench is formed.

Referring to FIG. 3, the nitrogen-containing compound on the surface of silicon oxide 202 in the trench is removed exploiting the anisotropy of dry-etching, while the nitrogen-containing compound sidewall residue 304 extending into the trench is formed on the surface of the silicon oxide corner structure. The nitrogen-containing compound sidewall residue 304 and a portion of the silicon oxide 202 in the trench together serve as a sidewall structure of the trench.

In step S170, the silicon oxide and the wafer are continue-etched downwardly using the nitrogen-containing compound sidewall residue as a mask and a second trench is formed.

Figure 4:
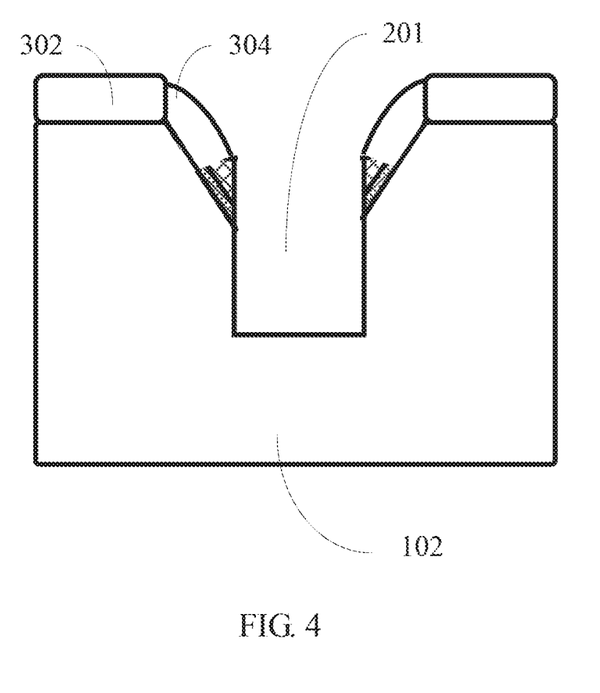

Referring to FIG. 4, the nitrogen-containing compound sidewall residue 304 covers only a portion of the first trench, such that areas not covered by the nitrogen-containing compound sidewall residue 304 will be etched downwardly (i.e., part of the silicon oxide 202, the sidewall oxide layer 204, and the epitaxial layer 102 are etched off) to form a second trench 201 (deep trench). The width of the second trench 201 is restricted by the nitrogen-containing compound sidewall residue 304, and apparently, the width of the second trench 201 is less than the width of the upper portion of the first trench. Once using the nitrogen-containing compound sidewall residue 304 as a hard mask for the second trench etching, a lithographic plate may not be required and cost can be saved.

In an embodiment, the second trench 201 has a depth of 10 μm or more.

In step S180, a silicon oxide layer is formed on a sidewall and a bottom of the second trench.

Figure 5:
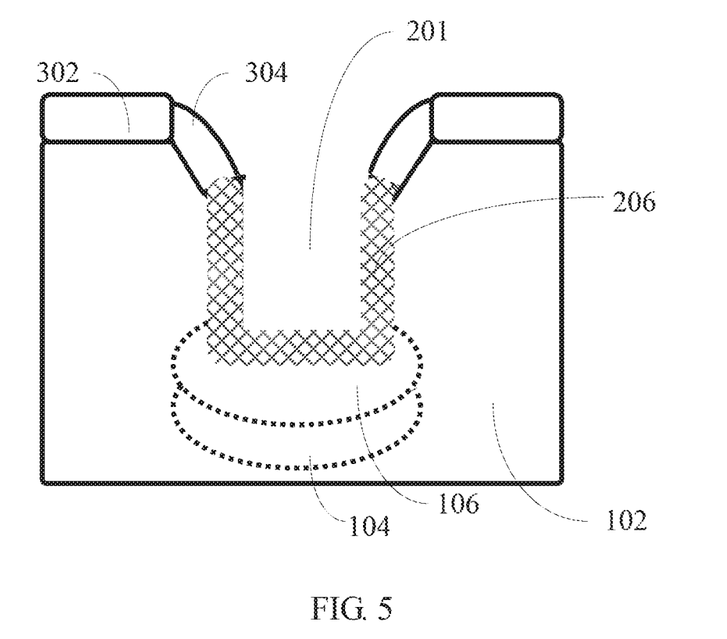

In this embodiment, since the silicon oxide layer 206 is formed by a thermal oxidation process, silicon oxide layer 206 will not be formed at a position covered by the nitrogen-containing compound sidewall residue 304, see FIG. 5.

In this embodiment, after the step S180, the method further includes the step of implanting N type ions and P type ions into the second trench 201 respectively, and forming a N type ring 104 and a P type ring 106 around the bottom of the second trench 201. In an embodiment, the N type ions are firstly implanted with a deep depth to form the N type ring 104; P type ions are then implanted with a shallow depth to form a P type ring 106 above the N type ring 104. In an embodiment, the implanted N type ions are phosphorus ions and the implanted P type ions are boron ions, and the P type ring 106 is wider than the N type ring 104 due to the faster diffusion rate of the boron ions. The N type ring 104 and the P type ring 106 are capable of forming longitudinal depletion, while the shallower P type ring 106 serves to reduce leakage from the P well regions of both sides of the trench isolation structure.

In step S190, polysilicon is deposited into the first trench and the second trench.

Figure 6:
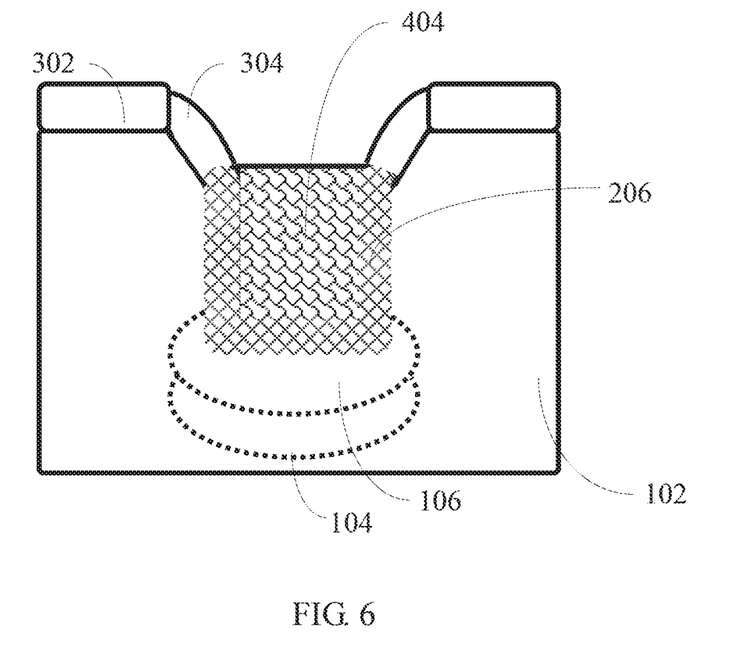

In an embodiment, the deposition of polysilicon is stopped after the deposition is conducted to a desired thickness. In this embodiment, an excess of polysilicon is deposited and then etched hack using the nitrogen-containing compound residue 304 as a mask to etch the polysilicon 404 to a desired thickness, such as below the nitrogen-containing compound residue 304, as shown in FIG. 6. By etching back the polysilicon 404, the residue caused by the polysilicon process of the device can be avoided as much as possible, thereby reducing the possibility of surface leakage. In an embodiment, the deposited polysilicon is intrinsic polysilicon.

In step S200, the nitrogen-containing compound is removed.

In order to remove the nitrogen-containing compounds completely, wet-etching may be employed, for example using concentrated phosphoric acid as the etchant. In this embodiment, the silicon nitride layer 302 and the nitrogen-containing compound sidewall residue 304 are removed together by concentrated phosphoric acid.

In step S210, silicon oxide is formed in the first trench to cover the polysilicon.

In this embodiment, the deposition of silicon oxide is performed using a high density plasma chemical vapor deposition (HDPCVD) process. After step S210 is completed, the silicon oxide exposed outside the first trench may be flattened by chemical mechanical polishing, see FIG. 7.

In the method of manufacturing the trench isolation structure, the structure of the first trench plus the second trench is adopted, the upper portion of the trench isolation structure has a large size (i.e., the first trench), thus the finally formed trench isolation structure can reduce the possibility of leakage caused by high voltage routing over the trench isolation structure relative to the narrow trench. Using the nitrogen-containing compound residue as a hard mask to etch the deep trench, the number of photolithography masks required to achieve the same isolation effect is saved.

The method of manufacturing the trench isolation structure described above is applicable to various semiconductor devices isolated using a deep trench isolation structure.

Figure 7:
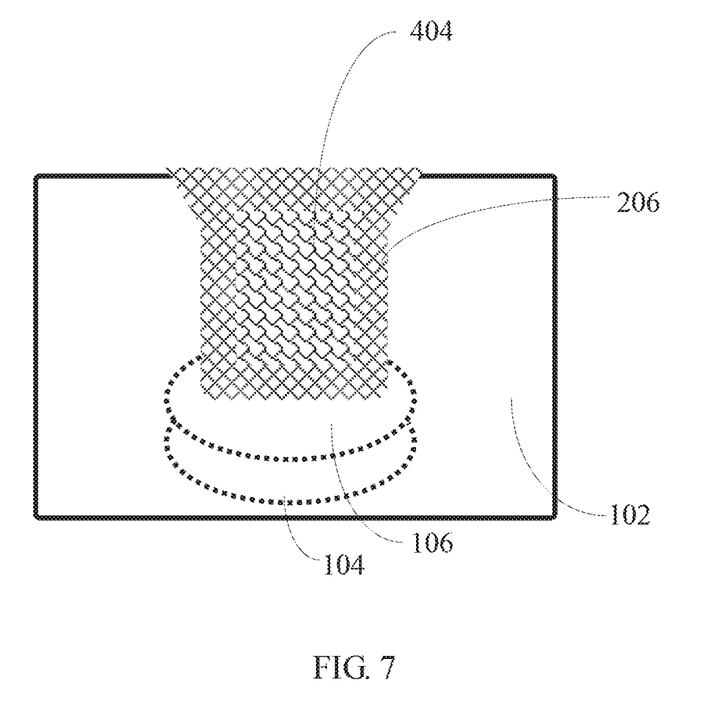

The present disclosure also provides a trench isolation structure accordingly. Referring to FIG. 7, the trench isolation structure includes a trench, silicon oxide 206 filled in the trench, and polysilicon 404 located in the trench and surrounded by the silicon oxide 206. The trench includes a bottle neck structure having a wide top and narrow bottom and a bottle body structure extending downwardly from the bottle neck structure.

In an embodiment, the trench isolation: structure further includes an N type ring 104 and a P type ring 106 located around a bottom of the bottle body structure, the P type ring 106 is located above the N type ring 104.

The foregoing implementations are merely specific embodiments of the present disclosure, and are not intended to limit the protection scope of the present disclosure. It should be noted that any variation or replacement readily figured out by persons skilled in the art within the technical scope disclosed in the present disclosure all fall into the protection scope of the resent disclosure. Therefore, the protection scope, of the present disclosure shall be subject to the protection scope of the claims.

What is claimed is:

1. A method of manufacturing a trench isolation structure, comprising:

forming a first trench having a wide top and a narrow bottom on a surface of the wafer;

filling silicon oxide into the first trench by depositing;

removing a portion of a surface of the silicon oxide in the first trench by etching;

forming a silicon oxide corner structure at a corner of the top of the first trench by thermal oxidation, the silicon oxide corner structure being a structure in which the silicon oxide in the first trench gradually becomes thicker from the corner downward;

depositing a nitrogen-containing compound on the surface of the wafer to cover the surface of the silicon oxide in the first trench and a surface of the silicon oxide corner structure;

dry-etching the nitrogen-containing compound, removing the nitrogen-containing compound on the surface of the silicon oxide in the first trench, and forming a nitrogen-containing compound sidewall residue extending into the trench on the surface of the silicon oxide corner structure;

continuing etching the silicon oxide and the wafer downwardly using the nitrogen-containing compound sidewall residue as a mask and forming a second trench;

forming a silicon oxide layer on a sidewall and a bottom of the second trench;

depositing polysilicon into the first trench and the second trench;

removing the nitrogen-containing compound sidewall residue; and forming silicon oxide in the first trench to cover the polysilicon.

2. The method according to claim 1, wherein the first trench has a depth of 1 to 2 µm, and the second trench has a depth of 10 µm or more.

3. The method according to claim 1, wherein the step of forming the silicon oxide layer on the sidewall and the bottom of the second trench is performed by a thermal oxidation process, and the formed silicon oxide layer has a thickness of at least 1000 angstroms.

4. The method according to claim 1, wherein after the step of forming the silicon oxide layer on the sidewall and the bottom of the second trench, prior to the step of depositing polysilicon into the first trench and the second trench, the method further comprises a step of implanting N type ions and P type ions into the second trench, respectively, and forming an N type ring and a P type ring around the bottom of the second trench.

5. The method according to claim 1, wherein prior to the step of removing the nitrogen-containing compound sidewall residue, the method further comprises a step of etching the polysilicon to a position below the nitrogen-containing compound sidewall residue.

6. The method according to claim 1, wherein prior to the step of filling silicon oxide into the first trench by depositing, the method further comprises a step of oxidizing a sidewall of the first trench.

7. The method according to claim 1, wherein prior to the step of forming the first trench having the wide top and the narrow bottom on the surface of the wafer, the method further comprises a step of forming a silicon nitride layer on the surface of the wafer, and the step of forming the first trench having the wide top and the narrow bottom on the surface of the wafer is to etch through the silicon nitride layer to form the first trench.

8. The method according to claim 1, wherein in the step of forming the silicon oxide corner structure at the corner of the top of the first trench by thermal oxidation, an oxidation temperature is from 800° C. to 950° C.

9. The method according to claim 1, further comprising a step of epitaxially growing of an epitaxial layer on a substrate by an epitaxial process, the epitaxial layer having a higher doping concentration than that of the substrate, wherein the step of forming the first trench on the surface of the wafer is to form the first trench in the epitaxial layer.

10. The method according to claim 1, wherein in the step of filling the silicon oxide into the first trench by depositing, the deposition of silicon oxide is performed by using a high-density plasma chemical vapor deposition process.

11. The method according to claim 1, wherein after the step of filling the silicon oxide into the first trench by depositing, prior to the step of removing the portion of the surface of the silicon oxide in the first trench by etching, the method further comprises a step of removing the silicon oxide layer exposed outside the first trench by chemical mechanical polishing.

12. The method according to claim 7, wherein after the step of filling the silicon oxide into the first trench by depositing, prior to the step of removing the portion of the surface of silicon oxide in the first trench by etching, the method further comprises a step of polishing the silicon oxide layer to the silicon nitride layer.

13. The method according to claim 1, wherein the step of removing the sidewall residue of the nitrogen-containing compound is performed by using concentrated phosphoric acid as an etchant.

14. The method according to claim 1, wherein in the step of forming the silicon oxide in the first trench to cover the polysilicon, the deposition of silicon oxide is performed using a high-density plasma chemical vapor deposition process.

15. The method according to claim 1, wherein after the step of forming the silicon oxide in the first trench to cover the polysilicon, the method further comprises a step of flattening the silicon oxide exposed outside the first trench by chemical mechanical polishing.

16. The method according to claim 1, wherein the step of forming the first trench having the wide top and the narrow bottom on the surface of the wafer is to dry etch using $CHCl_3$ and/or $CH_2Cl_2$ as an etchant.

17. The method according to claim 1, wherein the step of removing the portion of the surface of the silicon oxide in the first trench by etching is by dry-etching.

18. The method according to claim 17, wherein the step of removing the portion of the surface of the silicon oxide in the first trench by etching is performed using a high-density plasma etching process.

* * * * *